United States Patent
Lowe

[11] Patent Number: 5,940,138
[45] Date of Patent: Aug. 17, 1999

[54] ANALOG SIGNAL PROCESS WITH DITHER PATTERN

[75] Inventor: Virgil Lowe, Roswell, Ga.

[73] Assignee: J. Carl Cooper, Monte Sereno, Calif.

[21] Appl. No.: 07/962,177

[22] Filed: Oct. 14, 1992

Related U.S. Application Data

[63] Continuation-in-part of application No. 07/924,708, Aug. 4, 1992.

[51] Int. Cl.$^6$ ........................................................ H04N 7/24
[52] U.S. Cl. ........................................... 348/574; 341/131
[58] Field of Search .................................. 348/574, 572, 348/471, 472; 358/133, 138, 141, 13; 341/131; H04N 5/14, 7/13

[56] References Cited

U.S. PATENT DOCUMENTS

| | | |
|---|---|---|
| 3,244,808 | 4/1966 | Roberts . |
| 3,656,152 | 4/1972 | Gundersen . |
| 3,877,022 | 4/1975 | Lehman et al. . |
| 4,183,016 | 1/1980 | Sawagata . |
| 4,447,803 | 5/1984 | Crosby ........................................ 348/574 |
| 4,543,599 | 9/1985 | Willis et al. ............................... 348/574 |
| 4,827,343 | 5/1989 | Naimpally .................................. 348/574 |

FOREIGN PATENT DOCUMENTS

| | | | |
|---|---|---|---|
| 0543220 | 5/1993 | European Pat. Off. ................ 348/574 |
| 0167674 | 6/1992 | Japan ................................. H04N 5/14 |

OTHER PUBLICATIONS

Roberts, Lawrence Gilman "Picture Coding Using Pseudo-Random Noise" IRE Transactions On Information Theory pp. 145–154 1962, Feb.

Thompson et al., "A Pseudo–Random Quantizer for Television Signals" Proceedings of the IEEE vol. 55, No. 3 Mar. 1967.

*Primary Examiner*—David E. Harvey
*Attorney, Agent, or Firm*—J. Carl Cooper

[57] ABSTRACT

The present invention provides distortion compensating of an analog signal which is quantized by an A/D converter. A dither device processes a clock signal from a clock signal generator to provide an output signal with a known dither pattern. The output signal with the dither pattern has a plurality of different frequencies that are periodically repeated. In addition, the same frequency of respective cycles of the dither pattern has different phases. The dither signal is superimposed on the analog signal, thus, distortion of the analog signal is compensated or reduced subsequent to A/D conversion. In particular, this dithered analog signal may be converted into a digital signal in response to the clock signal which is used to generate the dither so that the digital signal approximates to the analog signal much more closely than if the equivalent digital signal were obtained by conventional analog to digital conversion.

43 Claims, 8 Drawing Sheets

ANALOG SIGNAL PROCESS WITH DITHER PATTERN

This application is a continuation-in-part of U.S. patent application Ser. No. 07/924,708 which was filed Aug. 4, 1992.

BACKGROUND OF THE INVENTION

The present invention relates to signal processing and, in particular, to analog signal processing. A major objective of the present invention is to compensate for distortion of a quantized analog signal using a dither of a known pattern. Thus, during converting the compensated analog signal into a digital signal, the quantizing error is significantly reduced.

Much of modern technology is closely identified with signal processing. Signal processing technology is commonly associated with converting an analog signal into a digital signal. Usually, analog to digital (A/D) conversion includes sampling of an analog signal, holding the sampled value, quantizing the sampled value and encoding the quantized value into a digital representation.

A digital signal quantity is discrete, allowing changes only at a certain sample distance, or quantizing value, whereas the analog signal changes continuously. What is expected during the quantizing of an analog signal is to approximate the analog signal as accurately as possible with minimum quantizing error. While converting the analog signal into the digital signal, quantizing error is inevitably introduced. Generally, quantizing error may be reduced at the expense of higher sampling accuracy; however, this increases the cost of the A/D converter.

In particular, an analog video signal is preferred to be converted into a digital video signal before processing, for example in a digital video system. Conventional TV systems usually employ a sequential scanning or an interlaced scanning to reproduce a picture imaged by a camera. In a TV system using such scanning, a complete picture is reproduced by a single raster. The fact that the digitized video signal will be displayed in a known raster format is useful in deriving a dither pattern which will operate to reduce the visible quantizing error.

Signal distortion which exists in analog TV video signals often causes blurred vision effect. When distortion of the analog TV video signal occurs during scanning, there may be flicker or other artifacts on reproduced pictures. In an extreme case, the distortion happens at an identical phase angle at respective corresponding scanning lines, a moire or other pattern will be visualized on the pictures of the TV screen. Moreover, distortion of an analog video signal increases quantizing error during A/D conversion, thereby impairing the quantization accuracy of the A/D conversion. One skilled in the art will recognize from the above description that if the analog distortion can cause the apparent quantizing error to be increased in a digitized television image, it is also possible that by selectively controlling analog distortion that the apparent quantizing error may be decreased. In particular, the quantizing error may be alternated on successive pixels, lines, fields, frames or combinations thereof in order that they will be integrated by the eye, and thus appear to disappear.

The quantizing distortion of a digital TV video signal can be addressed using different approaches. For example, an error feedback circuitry is disclosed by C. P. Sandbank in "Digital Television", pages 552–557, 1990. However, this error feedback circuitry is used to improve aliasing and quantizing distortions, which are more troublesome in chroma-keying than most other digital video processing operations. The system also assumes that the error is already present in the digitized video, thus serving to reduce error already introduced, whereas the present invention serves to reduce error before quantizing.

Most suggested prior art approaches address quantizing error by improving A/D conversion. However, those suggestions require a great deal of attention to improving the quantizing error itself during the quantizing stage of A/D conversion. Other prior art systems introduce random dither into the signal in order to randomize the error thus making it less offensive. Both of these approaches have drawbacks, namely cost and relatively poor performance. What is needed is an analog signal compensation before the A/D conversion, which provides offset distortion of the analog signal by using a known and controlled dither pattern. Furthermore, the compensated analog signal can be converted into a digital signal with moderated levels of quantizing error as compared to an uncompensated analog signal.

SUMMARY OF THE INVENTION

In accordance with the present invention, an analog signal processing device comprises means for modifying an analog signal with a dither signal of known pattern, and dither means for converting a frequency of a sampling signal at a variable pattern dividing ratio, thereby producing a dither signal for use in modifying the analog signal. The dither signal has a plurality of period dependent cycles with each having a predetermined phase. The cycles have different frequency components, thus, the dither signal has repeated frequency changes as well as different phases in respective cycles providing the compensating distortion for the analog signal.

A combining means is used to combine the dither signal with the analog signal, thereby generating a composite analog signal. The analog signal processing device of the present invention also comprises a signal generator for providing the sampling signal for use by the dither means. An A/D converter is provided for converting the composite analog signal into a digital signal in response to the sampling signal. Thus, the quantizing error during the A/D conversion is greatly modified. Preferably, the A/D converter has an output range of from 6 to 16 bits.

The purpose of the dither signal is to cause a 1 LSB change of the A/D converter in a known pattern, whenever the analog signal approaches a quantizing level of the converter by a known amount. It is desirable to have the output change in proportion to the magnitude of the difference between the nearest quantizing level and the actual signal value. For example, if the analog signal were actually ¼ of an LSB higher than the quantizing level of the A/D corresponding to the output, it would be desirable to cause the digital value of the A/D to increase by 1 LSB ¼ of the time. The average digital value, taken over 4 samples, would then be more accurately related to the proper analog signal value than if no change were made. Such improvement is of considerable value for static and slowly changing portions of the analog signal, which frequently are those areas where quantizing error is of most concern, and the taking of an average is of least problem. The taking of the average may be performed by or inherent in the ultimate perception of the digitized signal, for example in the persistence of vision when viewing a digitized image, or the ear's insensitivity in hearing a digitized sound. Additionally, the averaging may be inherent in the subsequent use or processing of the digital version of the analog signal, such as occurs in the delay time of certain CRT device phosphors, or the filling of a volume with reflected sound. Alternatively, intentional filtering may be utilized in order to take advantage of the digitized dithered signal.

The sampling signal may be generated by a signal generator in the dither means; alternatively, the sampling signal may also be supplied by other devices. In particular, the variable pattern dividing ratio conforms to P/N, where P and N are positive integers and 1>P>(N-1). Preferably, the ratio conforms to $\frac{1}{2}^N$, where N is a positive integer. Also, the analog signal processing device of the present invention may be applied to process any analog signal such as audio signals, but will find greatest utilization with periodic analog signals, such as a video analog signal, where the dither pattern may be related to the periodicity.

A preferred embodiment in accordance with the present invention is for processing an analog video signal. A signal generator provides a sampling clock signal in response to a synchronizing signal component of the analog video signal as is well known in the art. A dither means converts the frequency of the sampling clock signal at a variable pattern-dividing ratio in response to the synchronizing signal, to produce a dither signal. The dither signal has a plurality of components which have different frequencies and phases.

The combining means combines the dither signal with the analog video signal to generate a dithered video signal. Furthermore, an A/D converter is coupled to the combining means so that the dithered video signal from the combining means is converted into a digital signal in response to the sampling clock signal. Preferably, the output of the A/D converter is in a range of 6 to 12 bits for video.

A preferred method of the present invention comprises periodically converting a predetermined frequency clock signal at a predetermined dividing ratio to produce a dither signal. The dither signal has a variable pattern and a predetermined phase shift in respective cycles of the dither signal, which cycles are responsive to a video sync component in order to maximize the ability of the eye to average the quantizing error in the perceived signal. The dither signal is combined with the analog video signal so as to produce a dithered analog video signal. The dithered analog video signal may be converted into a digital signal by an A/D converter with substantially reduced quantizing error. Such improvement is especially true if the audio is quantized at sample rates which are 3 or more times the nyquist rate.

In another embodiment, when the dither compensation in accordance with the present invention is used to process an audio signal, it may reduce the distortion of the audio signal. Accordingly, an improved audio quantizing may be realized. Such improvement is especially true if the audio is quantized at sample rates which are 3 or more times the nyquist rate. Additionally, regulating the variable pattern-dividing ratio and the cycles of the dither pattern may be optimized to achieve particular sound qualities.

A TV video signal may be suitably processed with the present invention. The TV video signal will be compensated using the dither pattern, in which the consecutive scanning lines of each frame have the same variable pattern; and the variable frequencies of respective lines have different phases. Therefore, the process in accordance with the present invention may result in a more pleasing image. In particular, the quantizing error may be alternated on successive pixels, lines, fields or frames by alternating the pattern of the dither signal in order that the quantizing error will be integrated by the eye, and thus appear to disappear.

Another advantage shown herein is that the analog signal processed by the present invention is favorable for modifying the quantizing error induced during the A/D conversion as compared to previously known methods. Unlike most suggested approaches, the process in accordance with the present invention provides distortion of the analog signal in a regular and known pattern prior to A/D conversion. As a result, the digital signal more precisely approximates to the analog signal, and since it occurs in a known pattern, additional digital processing may be utilized for further error reduction after quantizing. These and other features and advantages of the present invention are apparent from the description below with reference to the following drawings.

DESCRIPTION OF THE PREFERRED EMBODIMENTS

Figure 1:
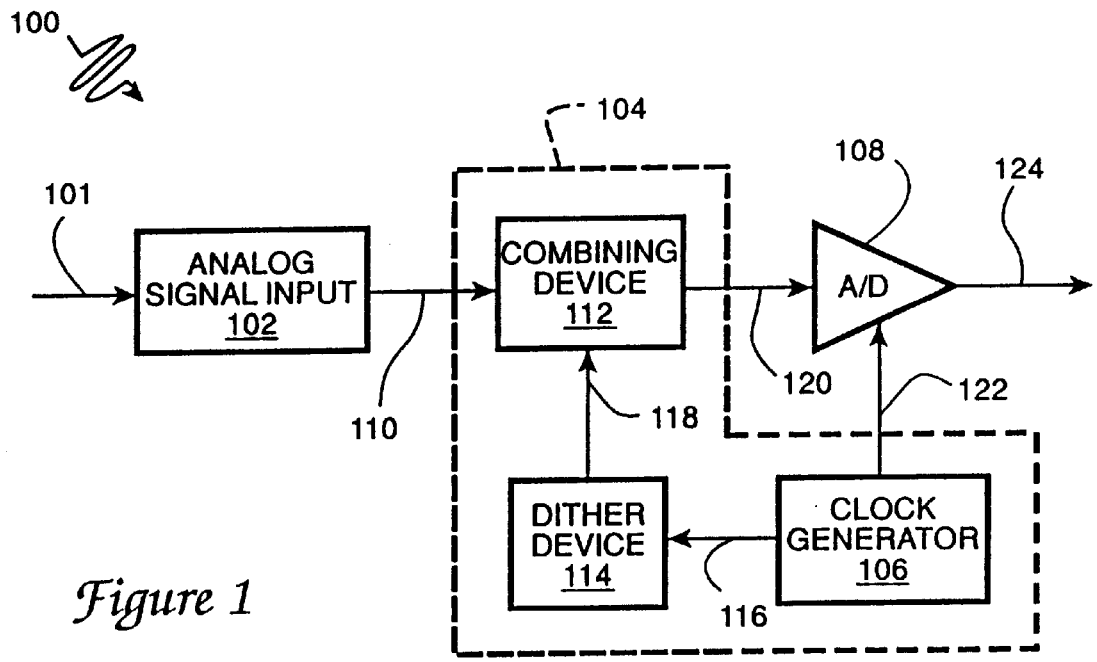
FIG. 1 is a diagram of an analog signal processing device in accordance with the present invention.

An analog signal processing system 100 in accordance with the present invention includes an analog input circuit 102, a processing device 104, and an A/D converter 108, as shown in FIG. 1.

An analog signal 101 is coupled to processing device 104 via analog signal input circuit 102 and coupling 110. The processing device 104 includes a clock generator 106, a combining device 112, and a dither device 114. Clock generator 106 produces a clock signal 116 with a predetermined frequency related to the sampling clock 122, which is applied to dither device 114. While clock generator 106 is incorporated in the dither device 114 to provide the clock signal, a clock signal provided by another device may also be processed by the analog signal processing system 100. As is common in the art, clock signal generator 106 may be responsive to the analog input, and in particular if the analog input is periodic or otherwise partitioned, to provide a synchronized clock. Dither device 114 functions as a frequency divider for converting the frequency of the clock signal by a variable pattern-dividing ratio.

The frequency of the clock signal is divided by a variable pattern-dividing ratio in dither device 114 to obtain an output signal with a variable pattern; the variable pattern-dividing ratio is selected to conform to P/N, where P and N are positive integers and 1>P>(N-1), and the process of variable pattern dividing is periodically repeated. Thus, the phase and/or frequency of the signal output from dither device 114 is variable in response to the variable pattern-dividing ratio. In the instance of a periodic analog signal 101, the variable pattern-dividing ratio may be repeated at a rate which is responsive to the periodicity or partitioning of the analog signal 101.

Dither device 114 may generate the dither signal by way of providing a plurality of signals 118 with different frequencies and/or phases. The signals then are selectively outputted under control of a controller in dither device 114. Thus, the output signal of the dither device 114 also appears as a signal having the variable pattern or phase.

Dither device 114 outputs a variable dither signal within a predetermined period. In addition, dither device 114 preferably shifts the phase of each cycle of the variable pattern signal on the basis of a predetermined pattern. Thus, the variable frequency signal from dither device 114 has a plurality of different frequencies in each cycle, and the variable pattern signal also has different phases in respective cycles. Alternatively, other known patterns may be utilized, for example pseudorandom sequences, decimal patterns and other patterns of the form P/N where P represents the number of first level (high) bits, N the number of second level (low) bits and P, N and the starting phase of the pattern are changed in response to the periodic nature of the analog signal.

The variable pattern signal may be regulated by changing the value of P or N depending on different requirements and signal types. This regulation is very helpful to match compensation for distortion to the nature of the analog signal. Similarly, the period of the variable pattern signal may also be controlled to achieve a predetermined compensation effect.

Combining device 112 may be implemented by an adder, a multiplier, a mixer and/or operator circuits. The combining device 112 serves to combine the dither signal with the analog signal from analog signal input circuit 102 in the proper ratios. The dithered analog signal output from combining device 112 is transferred to A/D converter 108 via 120. The sampling clock signal from clock generator 106 functions as a sampling signal being fed to A/D converter 108 via 122. The A/D converter thus converts the dithered analog signal into a digital signal in response to the sampling clock signal.

Figure 2:
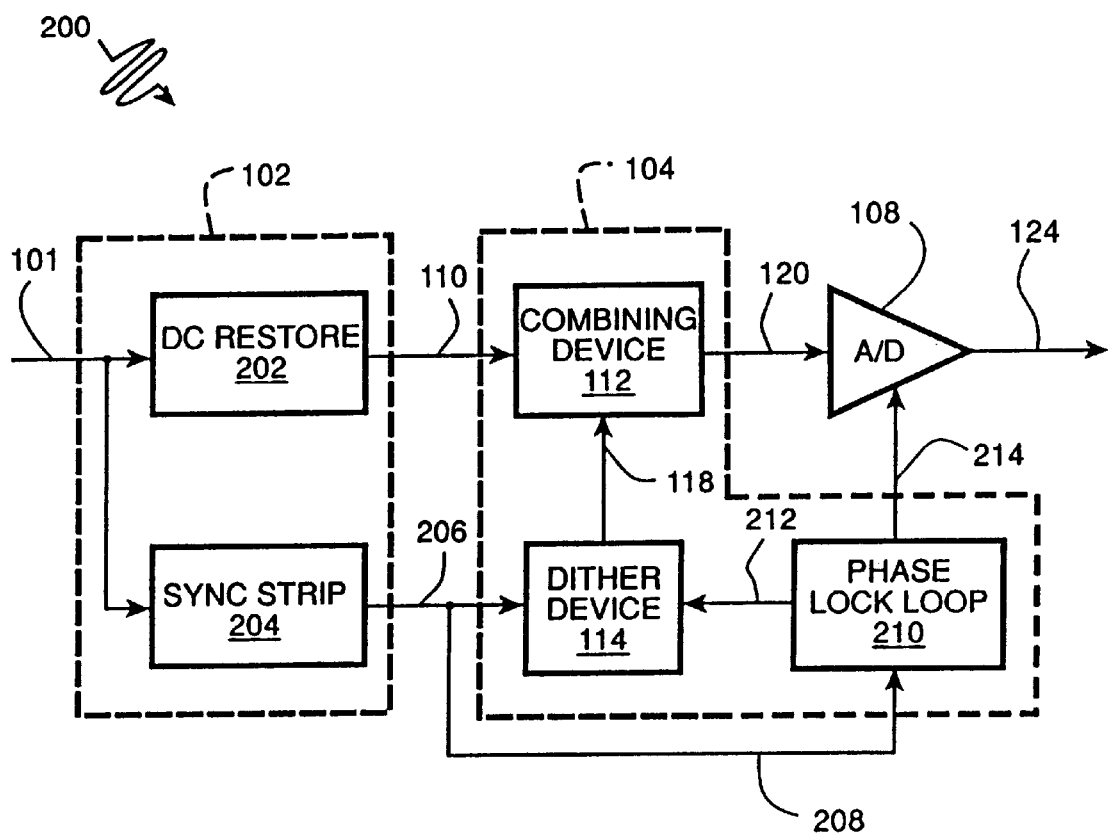
FIG. 2 shows a preferred embodiment of the present invention for processing an analog video signal.

As a preferred embodiment of the present invention, the system in accordance with the present invention is available to process most any analog video signal, for example a TV video signal as shown in FIG. 2. Signal input circuit 102 includes a DC (direct current) restore 202 and a sync (synchronizing) stripper 204, as shown in FIG. 2. DC restore 202 buffers the TV video signal and further ushers the buffered video signal to combining device 112 via coupling 110. The sync strip 204 is then used to separate horizontal synchronizing signals or color burst from the analog video signal as is well known in the art.

The horizontal synchronizing signal from sync strip 204 is applied to dither device 114 via 206 and a PLL (phase locked loop) 210 via 208, respectively. PLL 210 generates a sampling clock 214 which is phase locked to the sync signal as is well known in the art, and in addition supplies a clock signal 212 to the dither device 114, which clock is related to the sampling clock by a known ratio. PLL 210 may also function to synchronize the signals 214 and 212 with the input video color burst, in which case said color burst would be coupled to 210 via another connection. The clock output 212 of PLL 210 for example having a frequency of 10.7 MHz, 13.5 MHz or 14.3 MHz as are well known and commonly used in the art. Dither device 114 converts the frequency of the clock signal to the variable pattern dither signal 118, which in preferred form is a binary pattern comprising combinations of 1 in 4, 2 in 4 and 3 in 4 as will be described more fully below.

Specifically, the horizontal synchronizing signal allows dither device 114 to control the dither signal 118 so that corresponding to each cycle of the horizontal synchronizing signal, dither device 114 generates a different output signal with a frequency determined by the dividing ratio P/N. The value of P/N may be varied as required.

Figure 3:
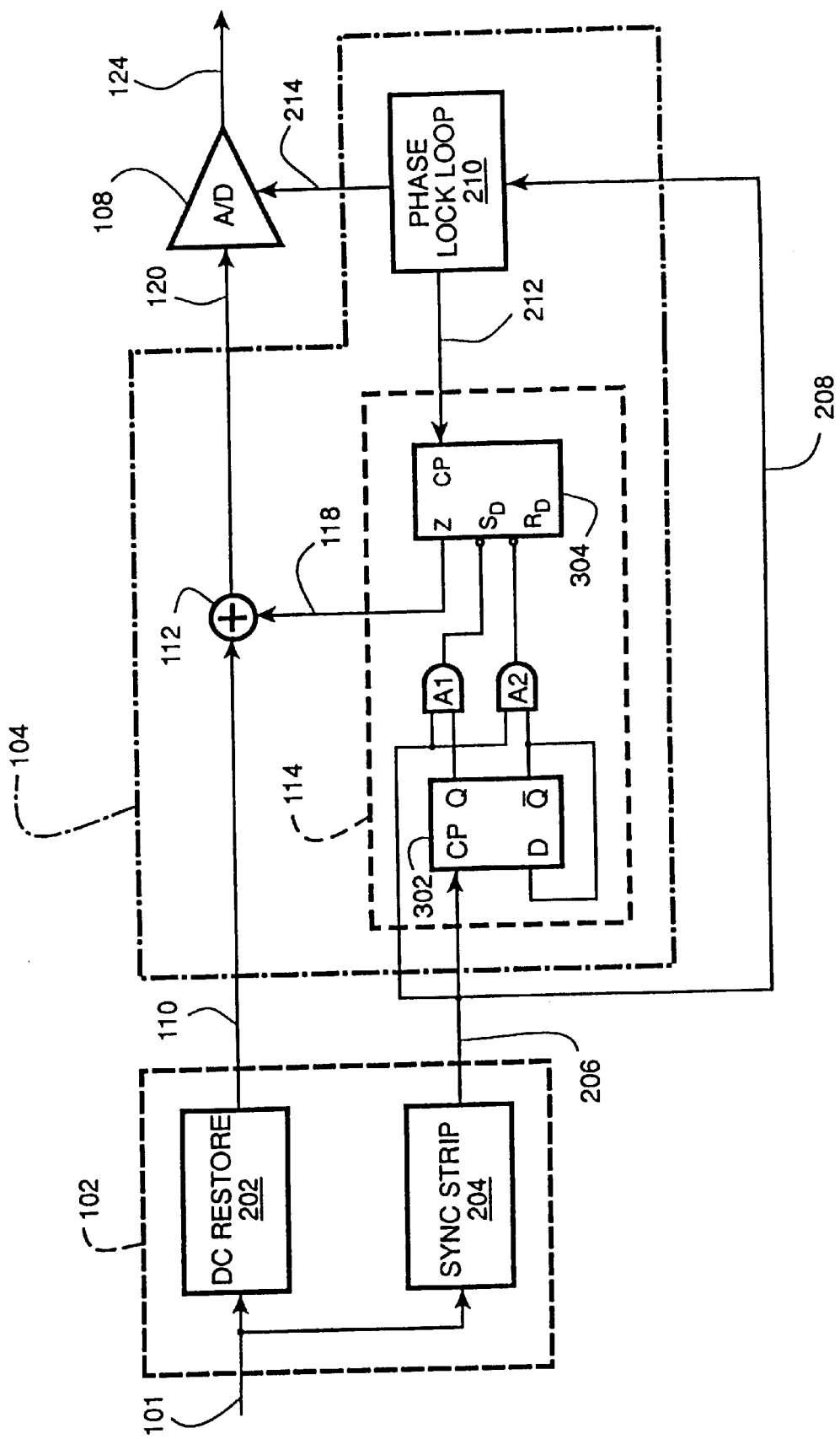
FIG. 3 illustrates a detailed circuit diagram of FIG. 2.

A detailed circuitry of FIG. 2 is shown in FIG. 3, where dither device 114 is implemented by a flip-flop 302, AND gates A1 and A2, and a counter 304. Flip-flop 302 is connected so that upon arrival of the horizontal synchronizing signal from sync strip 204, the present Q output of flip-flop 302 is toggled. For example, when the Q output of flip-flop 302 is at a low level, a trigger from the horizontal synchronizing signal sets the Q output of flip-flop 302 to a high level. Furthermore, upon the arrival of the next trigger edge of the horizontal synchronizing signal, flip-flop 302 will provide a low level at the Q output. The Q bar output is the opposite polarity with respect to the Q output.

The horizontal synchronizing signal from sync strip 204 is also applied to the inputs of both AND gates A1 and A2. The Q output of flip-flop 302 is coupled to another input of AND gate A1 so that the Q output is ANDed with the horizontal synchronizing signal at AND gate A1, generating an ANDed output. On the other hand, the Q bar output of flip-flop 302 is ANDed with the horizontal synchronizing signal at the inputs of AND gate A2. The output signals of AND gates A1 and A2 are fed to the set and reset inputs of counter 304 to set its counting state.

Counter 304 functions as a multiple frequency divider with different variable pattern-dividing. The clock signal from PLL 210 is applied to counter 304 where the variable pattern-dividing process is performed. Once the output signal from AND gate A2 arrives at $R_D$ input, counter 304 begins the dividing process of the clock signal at a first variable pattern. This pattern lasts until the output of AND gate A1 triggers $S_D$ input of counter 304. Counter 304 then begins a variable pattern-dividing process at a second pattern, which will continue until the output of AND gate A2 sets counter 304 again. The alternative outputs of AND gates A1 and A2 trigger counter 304 to produce a dither signal having the variable pattern, which in this example changes at the horizontal sync rate.

Timing of the variable pattern dividing process depends on the signal to be processed. Accordingly, under the control of the alternative outputs at AND gates A1 and A2, an output signal with different frequencies may be obtained. The frequency-dividing pattern changing process may be repeated periodically as well as continuously. For example, in a more complex system wherein the outputs of A1 and A2 are used to control the division coefficient, the frequency of the clock signal would be consecutively divided by a variable ratio in an order of ¼, ½ and ¾. The variable ratio is further periodically repeated.

Therefore, the output signal of counter 304 has a phase or a frequency that is periodically varied. This variable pattern signal is superimposed on the buffered video signal at combining device 112 implemented by a signal adder. A/D converter 108 converts the composite analog video signal from combining device 112 into a digital signal in response to the clock signal being used for a sampling signal of A/D converter 108.

Figure 4:
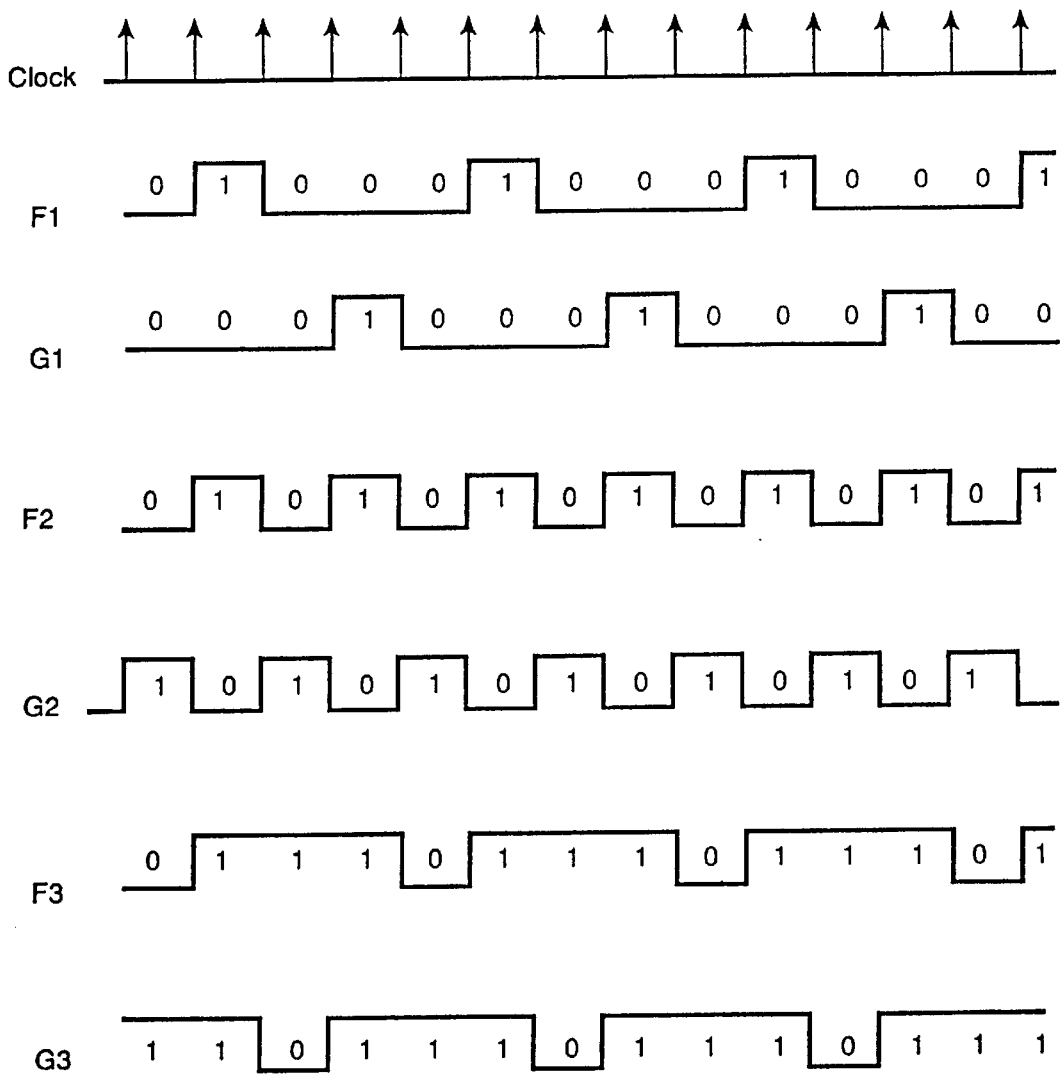
FIGS. 4 and 5 show an example of a dither pattern of the present invention.
Figure 5:
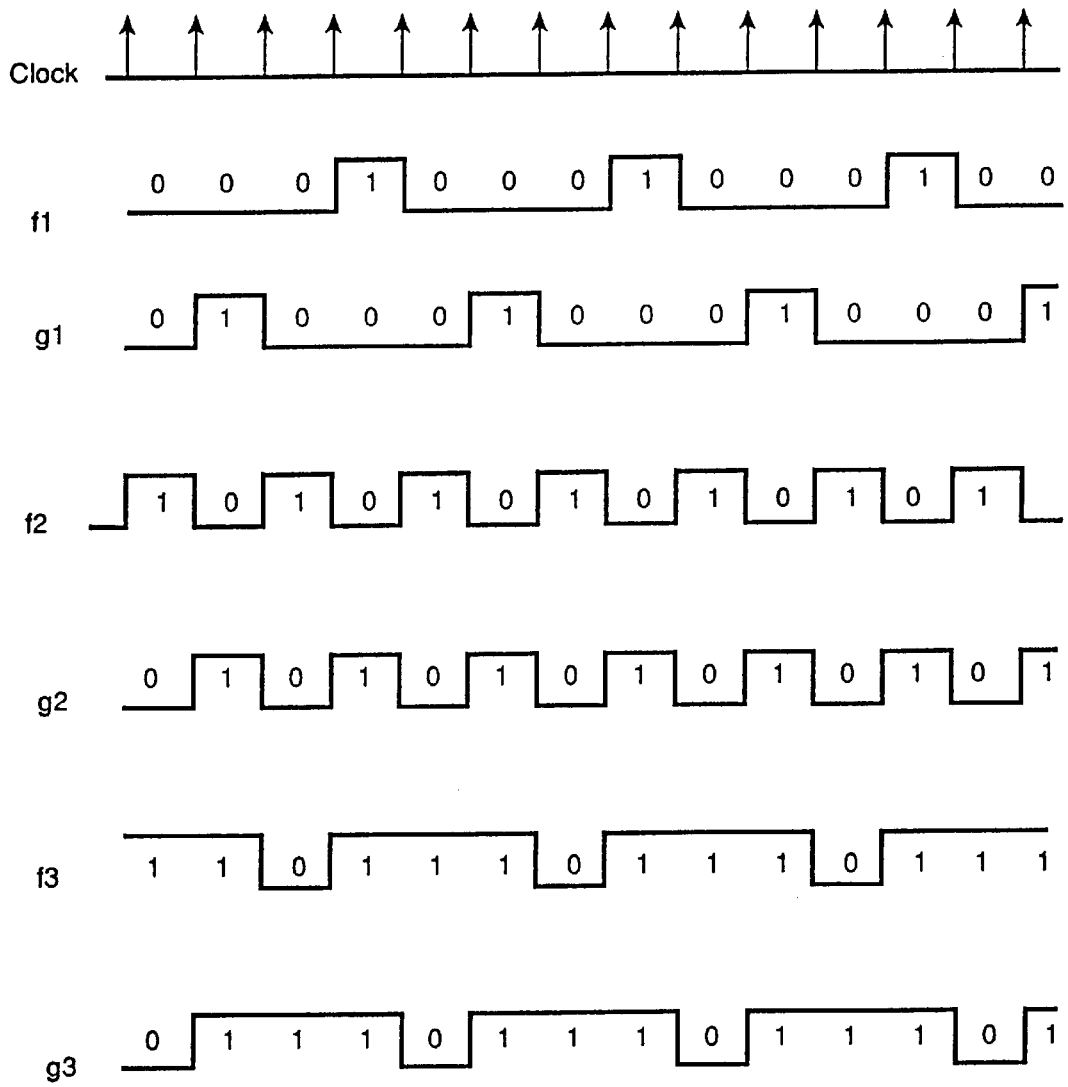

FIGS. 4 and 5 show an embodiment of the dither pattern applied to an interlaced 525 or 625 line video signal. As shown in FIG. 4, the scanning of the interlaced video is performed by alternatively scanning two consecutive rasters. F1, F2 and F3 represent those consecutive scanning lines of a first field raster. Similarly, G1, G2 and G3 represent those consecutive scanning lines of a second field raster. These two succeeding rasters comprise a first frame of the video picture.

As for the first raster, as shown in FIG. 4, scanning line F1 represents a dither pattern related to a sampling clock with the dither pattern derived by dividing the sampling clock signal by a ¼ pattern. Scanning line F2 is also the sampling clock signal derived by the dividing of the clock signal by 2, and F3 is derived by dividing the clock signal derived from the dividing of the clock signal by a ¾ pattern. The frequency-dividing process is repeated in the following scanning lines of the first raster. Likewise, scanning line G1 of the second raster is a clock signal derived from the dividing of the clock signal by a ¼ pattern, but out of phase with F1. Scanning line G2 of the second raster is a clock signal derived from dividing of the clock signal by 2, but in the opposite phase of F2, and G3 is a clock signal derived by dividing the clock signal by ¾ but in opposite phase of F3. This frequency-dividing process is also repeated in the following scanning lines of the second roster.

Although every pair of consecutive scanning-lines of the first frame, F1 and G1, have the same frequency with respect to each other, the two consecutive scanning lines of the first frame have different phases. As a result, the dither pattern causes a predetermined distortion of the analog video signal.

Moreover, conventional interlaced 525 or 625 line video has an odd number of scanning lines per frame. Therefore, if the variable pattern-dividing ratio varies in the order of ¼, ½ and ¾, then the first scanning line of a second frame following the first frame has a frequency the same as the first scanning line of the first frame, but a phase which is opposite. In other words, inverting the dither on respective pairs of scanning lines of the first frame generates canceling of respective pairs of scanning lines of the second frame.

FIGS. 4 and 5 show the mentioned relationship between two consecutive frames that are dithered. Comparing the first frame of FIG. 4 with the second frame of FIG. 5, it may be found that the dither on respective pairs of scanning lines of the second frame are an inverted version of the corresponding pairs of scanning lines of the first frame. For example, a pair of scanning lines F1 and G1 of the first frame corresponds to a pair of scanning lines g1 and f1 of the second frame, respectively, and the pair of scanning lines f1 and g1 of the second frame may be derived simply with inversion of the pattern of the pair of scanning lines F1 and G1 of the first frame. Likewise, the inverse of F2 and G2 may produce f2 and g2. The pattern may also be described as being shifted in position with respect to the start of the line, field and frame periods.

Figure 6:
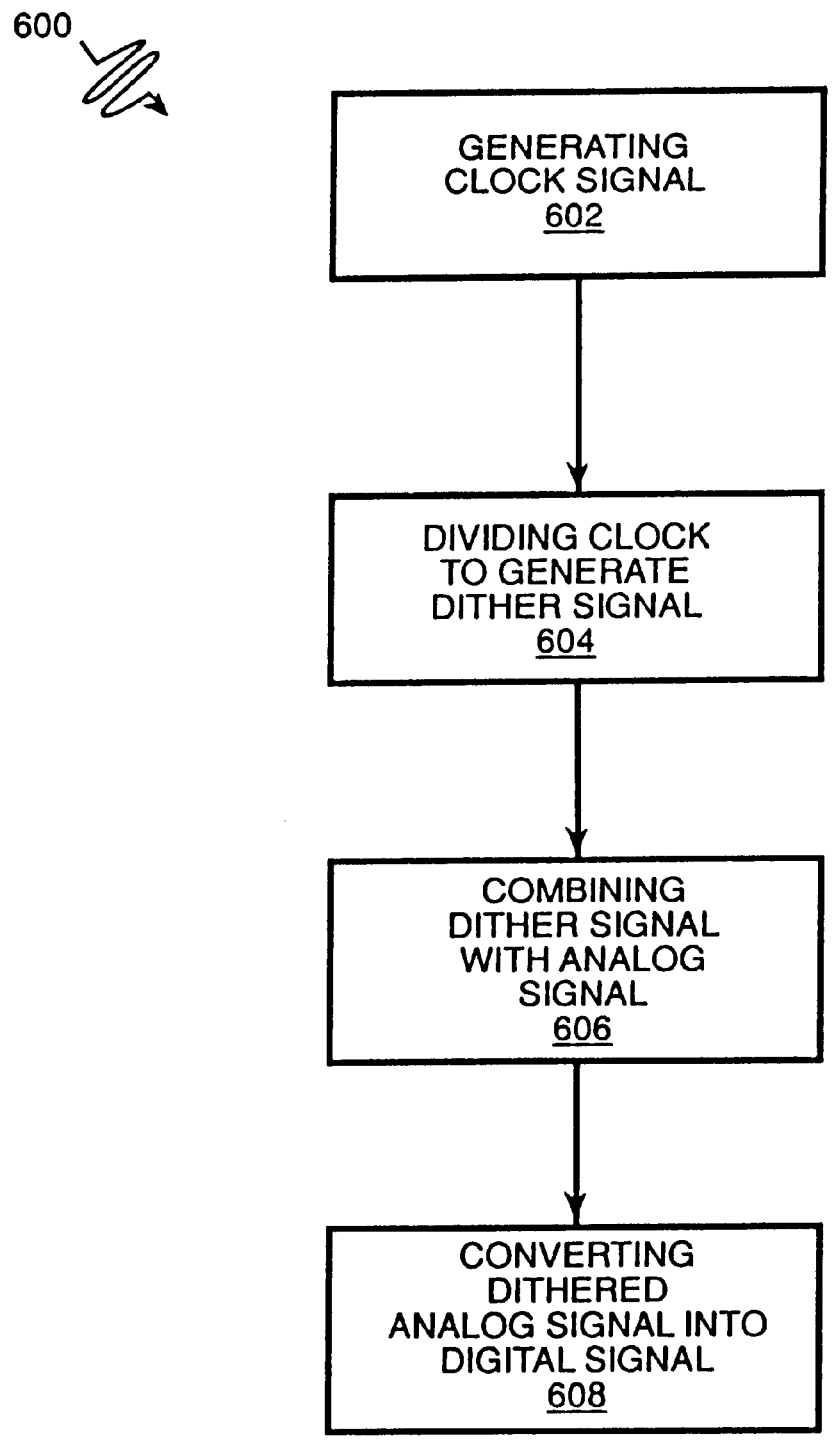
FIG. 6 is a flow chart of an analog signal processing method in accordance with the present invention.

A dither method 600 for an analog signal is shown in FIG. 6. A clock signal is first generated at procedure 602. The clock signal is then divided by a known ratio and phase pattern at procedure 604. As an example, the ratio conforms to $½^N$. In addition, the ratio is periodically varied so that the derived clock signal is a variable pattern signal. In each cycle of the variable signal, there are a plurality of different frequency components. Also, respective cycles have different phases.

The variable pattern signal is combined with the analog signal at procedure 606, thereby generating a dithered analog signal. Moreover, the dithered analog signal is sampled in response to the clock signal and is converted into a digital signal, which is implemented at procedure 608. The method of the present invention may also be applied to process analog audio signals and analog video signals. Preferably, a digital TV video signal with reduced quantizing error is achieved using the method of the present invention.

Figure 7:
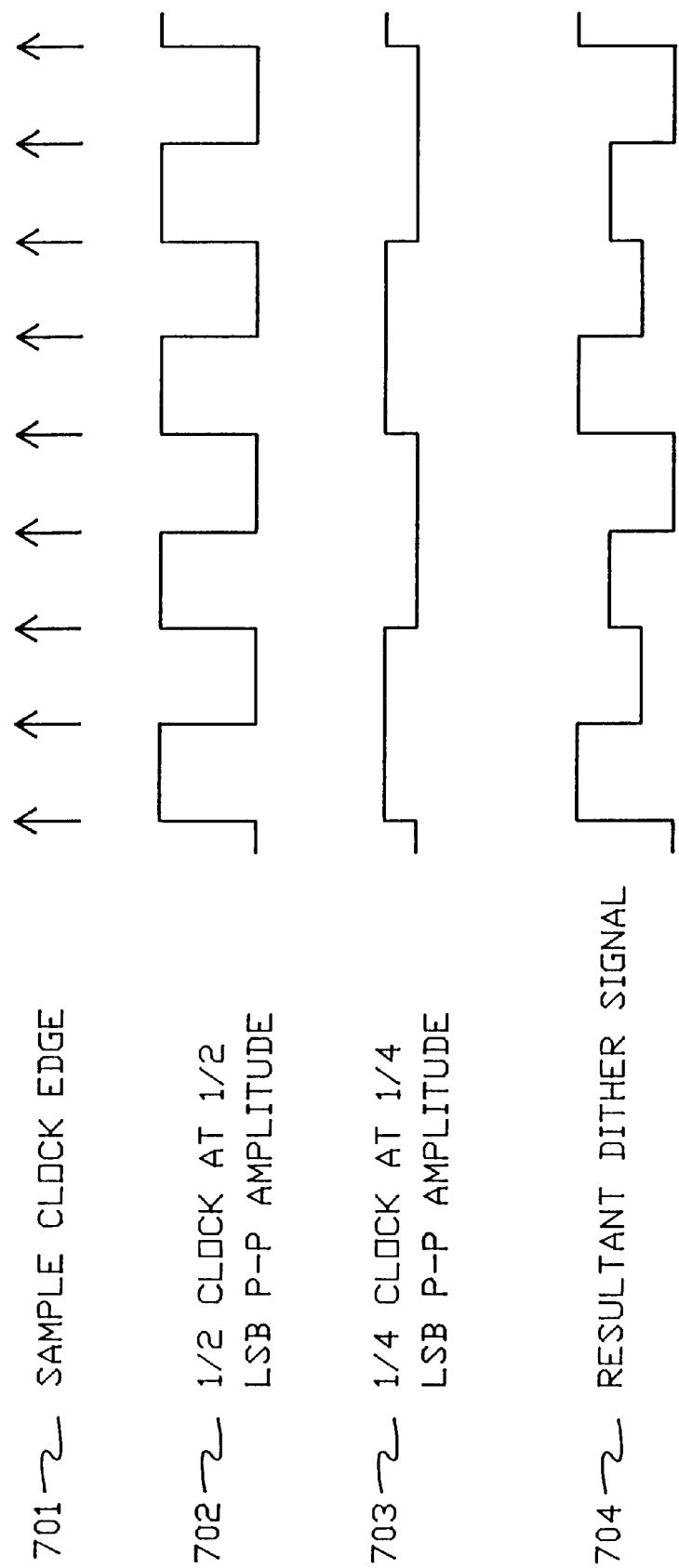
FIG. 7 shows a dither pattern of a useful embodiment of the invention.

FIG. 7 shows an embodiment of the invention which utilizes a four level dither, which is implemented by the combination of two dither signals at different amplitudes. Line 701 shows the sampling clock which is coupled to the dither generating circuit. 702 shows the first dither signal at ½ the clock frequency and ½ the amplitude of the LSB of A/D converter (ADC), with 703 showing the second dither signal at ¼ the clock frequency and ¼ the amplitude of the LSB. 704 shows the resultant dither signal which is the combination of the two individual dither signals.

For example, if the ADC is 8 bits, it will have 256 sampling levels. If the input from negative clip to positive clip is one volt, each sampling LSB level will be ¹⁄₂₅₆V or 3.91 mV. The ½ clock dither voltage will be 1.95 mV. The ¼ clock dither voltage will be 0.95 mV. The combined dither signal will be 4.86 mV peak to peak. The combined dither signal is added to the analog input signal before it is applied to the ADC. The combination dither and analog signal will cross the threshold of a particular digital code in the ADC at a range that depends upon the input signal and the dither signal. For example, if no dither is added to the input, the input would have to change by 3.91 mV to cause a one LSB change in the ADC output. With the dither signal added, the LSB of the ADC will change ½ of the time with a 1.95 mV change. Since the LSB which corresponds to a 3.91 mV change is only changing ½ the time, the average of the change is 1.95 mV or the equivalent of a 9th bit. Similarly, with a 0.975 mV change, the LSB of the 8 bit ADC will change ¼ of the time, thus the average of the change will correspond to a 10th bit. Clearly, the accuracy of the digital representation of the analog signal will be increased by such a scheme. With the use of a changing dither pattern, the LSB pattern changes of the 8 bit converter is caused to change accordingly when the value of the analog signal is within ½ or ¼ of a quantizing threshold of the 8 bit ADC. By changing the LSB pattern in a manner that the human eye, or a digital filter, will tend to average, the net result is that greater than 8 bit resolution is achieved in the digital version of the analog signal.

In the preferred embodiment of the invention, the phase of the dither signal is changed in a predetermined way to facilitate the aforementioned averaging. The preferred phase change is to change the polarity of each component of the dither signal on a line to line basis such that the pattern exactly cancels on a frame to frame basis.

Figure 8:
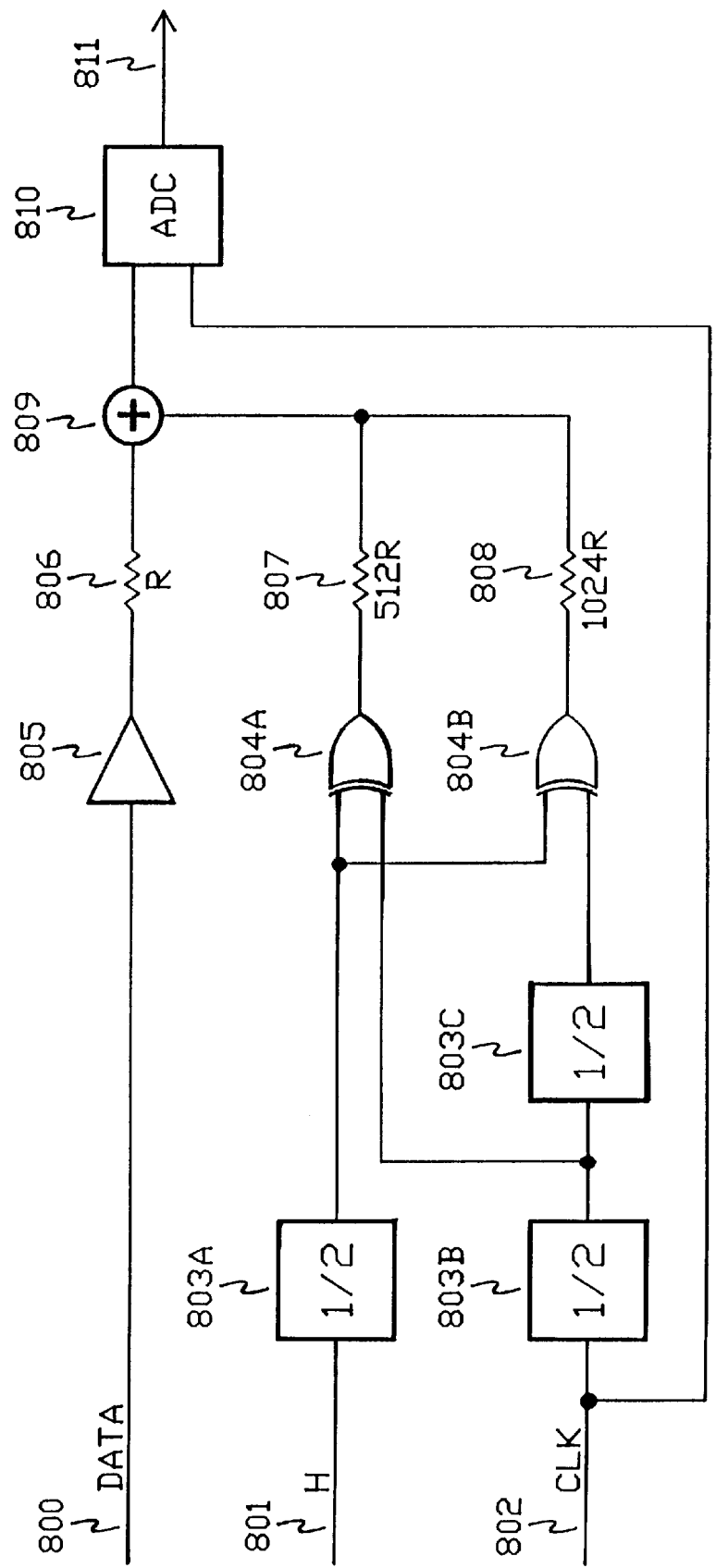
FIG. 8 shows an embodiment of the invention corresponding to FIG. 7.
Figure 9:
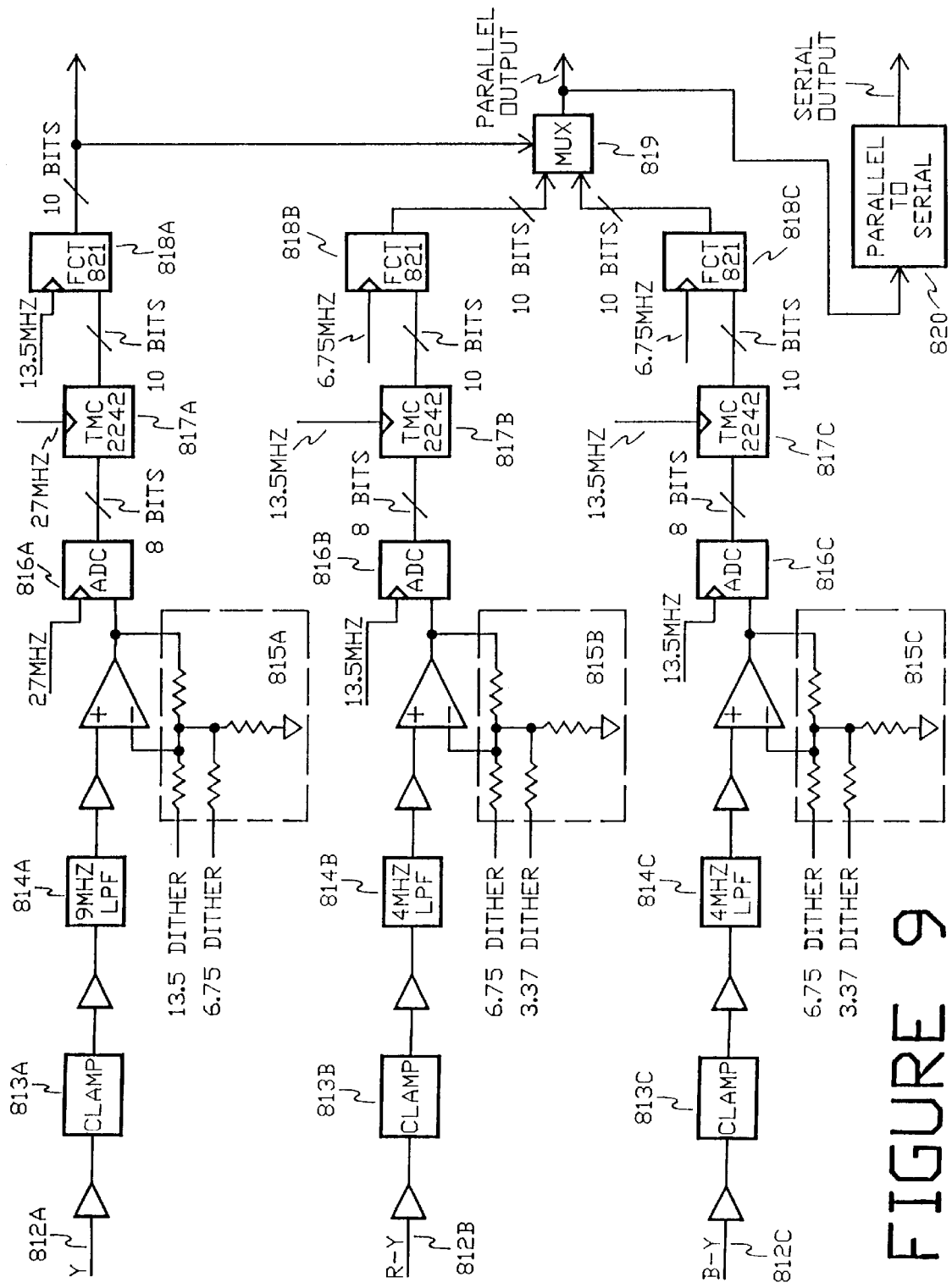
FIG. 9 shows an embodiment of the invention utilizing FIG. 7.

FIG. 8 shows a diagram of a circuit which will provide the preferred embodiment dither signal for increasing video resolution by 2 LSBs. The analog video signal is input at 800, buffered by 805 and coupled to summing network 809 via resistor 806. The ADC 810 outputs an 8 bit digital version of the analog signal at 811. Horizontal sync of the video signal at 801 is divided by 2 in divider 803a, providing a H/2 rate signal for EXOR gates 804. The ADC sampling clock at 802 is divided by 2 by a first divider 803b and again by 2 by a second divider 803c. The clock/2 signal is coupled to the other input of EXOR 804a and the clock/4 to EXOR 804b. The EXORs thus serve to invert the polarity of the two dither components on a line by line basis. The ½ clock dither signal is coupled to the video signal with a magnitude equal to ½ LSB of the ADC, in this instance an 8 bit converter. The ¼ clock dither signal is coupled to the video signal with a magnitude equal to ¼ LSB of the ADC. The proper weighting of the dither signals is controlled by the coupling resistors 807 and 808, which have magnitudes of 512R and 1024R, respectively. Although a separate summing device is shown as 809, in practice this can simply be the junction of the resistors.

If one wished to obtain yet more precision, the circuit of FIG. 8 can be expanded by adding more dividers, EXORs and summing resistors as will be apparent to one skilled in the art in view of the present disclosure. For example, a clock divided by 8 can be inverted in phase on a line to line basis, and summed through a 2048R resistor to give a third bit of precision. Other phase changing relationships and patterns can be utilized as well. For example, a clock/2 signal could be utilized on one line and a clock/4 on the next, etc., instead of combining both on the same line. Another alternative is to use clock/2 every line, with the weighting changing line to line so that a ½ LSB weighting is used on one line and a ¼ LSB on the next, etc. Patterns can thus be generated horizontally, vertically, diagonally, or in time (frame to frame or field to field). Combinations of the above can also be utilized. Non-binary and non-integer divisions could also be used. For example, a dither weighing of ⅓ generated with clock/3 or a weighing of ⅟3.5 with a clock/3.5.

The above circuits are well suited to being included within the A/D converter IC, allowing a given resolution converter to be improved significantly. For example, an existing technology 8 bit converter can be improved to output 10 bits by the inclusion of the circuit of FIG. 8 and the addition of a simple noise reduction circuit on the 8 bit A/D output. The dither circuit reduces the quantizing noise, and the noise reduction circuit averages the 8 bit signal to provide a 10 bit signal, thus providing increased resolution output. Such noise reduction circuits are well known in the art, for example those described in U.S. Pat. Nos. 3,009,016 by Graham, 4,072,984 by Kaiser, and 4,305,091 by Cooper.

One skilled in the art will recognize that the above described functions and components are somewhat more complex than represented by the present block diagrams, however from the disclosure and teachings herein, taken with the applications literature available from the manufacturers of the suggested components, or from other components which may be substituted as will be known from the above disclosure, the construction of a practical and operatable device will be well within the capability of one skilled in the art without resorting to further invention or undue experimentation.

It will also be understood that the previous descriptions and explanations are given by way of example, and that numerous changes in the combinations of elements and functions as well as changes in design may be made without departing from the spirit and scope of the invention as hereinafter claimed. For example, an available periodic signal, other than a clock generator included in the dither device, may be used to generate the dither signal. The variable pattern-dividing ratio may also be adjusted so that the ratio is pseudorandomly repeated during the field or frame and then repeated in the opposite phase on the succeeding field or frame. Other types of known patterns may be utilized to suite the requirements of minimizing quantizing error with specific signals, as will be apparent to one skilled in the art from the present teachings. These and other modifications to and variations upon the embodiments described above are provided for by the present invention, the scope of which is limited only by the following claims.

What is claimed is:

1. A device for converting a periodic analog signal to a digital signal, comprising:
   means for providing the analog signal;
   dither circuit responsive to a clock signal to generate a dither signal having a pattern including a repeating plurality of cycles with said cycles alternating relative to the period of said analog signal;
   an A/D converter circuit responsive to said dither signal and said analog signal to provide said digital signal.

2. An analog signal processing device for changing said analog signal to digital form with an A/D convertor, which analog signal has at least one repetitive period characteristic defined in respect to a synchronizing element comprising:
   means for providing the analog signal;
   dither circuit responsive to a clock signal to generate a dither signal having a regular known pattern of values said pattern having a predetermined phase with respect to said period, said dither circuit operative to alter the sequence of said values of said known pattern in response to said synchronizing element;
   an analog to digital conversion circuit responsive to said pattern of values and to said analog signal to provide said digital form thereof.

3. An analog signal processing device for converting said analog signal to digital form in an A/D convertor, comprising:
   means for receiving said analog signal;
   dither means responsive to a clock signal to generate a dither signal having a pattern repeated every N clocks and having at least N equally spaced magnitude values corresponding to 1 LSB÷N where N is 3 or greater with said pattern having a starting phase relationship with respect to a periodic characteristic of said analog signal, with said starting phase relationship of said pattern changing;
   quantizing means responsive to said dither signal and said analog signal to provide said digital form.

4. An analog signal processing device for converting said analog signal to digital form with an A/D convertor, comprising:
   means for providing said analog signal;
   dither circuit providing a clock signal responsive to said analog signal and further providing a dither signal in response to said clock signal, said dither signal having a pattern of different values with said dither circuit operative to periodically create a phase discontinuity in said pattern in response to said analog signal;
   said A/D convertor responsive to said dither signal and said analog signal to provide said digital form of said analog signal.

5. An analog signal processing device as recited in claims 1, 2, 3 or 4 wherein said analog signal is a video signal having a frame and said dither signal experiences a phase discontinuity in response to a sync pulse for at least each said frame.

6. An analog signal processing device as recited in claims 1, 2, 3 or 4 wherein said analog signal is a video signal and said dither signal pattern takes on a different phase for at least each horizontal line.

7. An analog signal processing device as recited in claims 1, 2, 3 or 4 wherein said clock signal is divided by at least first and second division coefficients to provide a plurality of frequency components with the phase of a first of said frequency components being changed in a first pattern and the phase of a second of said frequency component being changed in a second pattern with said dither signal being responsive to said frequency components.

8. An analog signal processing device as recited in claims 1, 2, 3 or 4 wherein said analog signal is periodic and said dither signal pattern repeats every X clocks and takes on a first value every N clocks within said X clocks where N and X are integers and wherein the starting phase of said dither signal pattern is changed at least every analog signal period.

9. An analog signal processing device as recited in claims 1, 2, 3 or 4 wherein said dither signal pattern repeats every X clocks and takes on at least first and second values with said second value occurring every N clocks within a cycle of X clocks where N and X are integers and wherein the starting phase of said dither signal pattern is changed at least every analog signal period.

10. An analog signal processing device as recited in claim 1, 2, 3 or 4 wherein said values in said pattern are current or voltage values with said pattern being phase shifted in non inverting fashion on successive periods of said analog signal.

11. An analog signal processing device as recited in claim 1, 2, 3 or 4 wherein said analog signal has a period and said dither signal pattern takes on at least two values with P first values and N second values occurring during said period with P and N being integers which are changed every said period.

12. A processing device for an analog video signal having an associated synchronizing type component, said processing device comprising:
   a sampling clock generator for providing a sampling clock signal and a dither clock signal in response to said synchronizing type component;
   dither circuit responsive to said dither clock to provide a dither signal having a regular pattern which is changed in a known fashion in response to said synchronizing type component;
   converting circuit responsive to said dither signal and said analog video signal to provide a dithered digital video signal.

13. A processing device for an analog video signal having an associated synchronizing type component, said processing device including:
   a sampling clock generator for providing a sampling clock signal and a dither clock signal wherein said sampling clock is a frequency multiple of said synchronizing component and said sampling clock generator further comprises a phase control signal generator for generating a phase control signal in response to said synchronizing component; and a frequency divider for converting the frequency of said sampling clock signal thereby providing said dither signal, said phase control signal generator controlling said frequency divider so that said dither signal has a regular pattern with a predetermined phase shift and a component which is alternated in response to said synchronizing component; and
   a converting circuit responsive to said dither signal and said analog video signal to provide a dithered digital video signal.

14. A processing device for an analog video signal having an associated synchronizing type component, said processing device comprising:
   a sampling clock generator for providing a sampling clock signal and a dither clock signal in response to said synchronizing component;
   dither circuit responsive to said dither clock to provide a dither signal having a regular pattern with a component which is alternated in response to said synchronizing component:
   converting circuit responsive to said dither signal and said analog video signal including an analog to digital convertor to provide said dithered digital video signal in response to said sampling clock signal and further including a filtering circuit to filter said dithered digital video signal to reduce the visibility of said dither.

15. A processing device as recited in claim 13 further including an analog to digital convertor having a given output precision and further including processing circuitry responsive to said dithered digital video signal to increase said output precision by at least one bit with said dither signal pattern being comprised of a plurality of periodic square wave components.

16. A processing device for an analog video signal having an associated synchronizing type component, said processing device comprising:
   a sampling clock generator for providing a sampling clock signal and a dither clock signal in response to said synchronizing component;
   dither circuit responsive to said dither clock to provide a dither signal having a regular pattern with a component which is alternated in response to said synchronizing component and wherein said regular pattern has a plurality of versions and each said version is periodically repeated P times in N cycles of said dither clock signal, in a ratio of P:N, where P and N are positive integers and $1 \geq P \geq N$;
   circuit responsive to said dither signal and said analog video signal to provide a dithered digital video signal.

17. A method for digital conversion of an analog signal comprising steps of:
   converting a frequency of a clock signal at one or more predetermined ratio so as to generate a plurality of component signals each having a known pattern which component signals are combined to provide a dither signal, said dither signal having a variable pattern produced by introducing a phase discontinuity in said known pattern of one or more of said component signals; and
   using said dither signal and said analog signal with an A/D converter to produce a dithered digital signal.

18. A dither method as recited in claim 17 wherein said analog signal is a periodic signal and said dither signal includes a sequence of values which change order in response to said period.

19. A method for digital conversion of an analog video signal comprising steps of:
   converting a frequency of a clock signal at a predetermined ratio so as to generate a plurality of component signals each having a known pattern which component signals are combined to provide a dither signal having a variable pattern produced by changing the phase and/or polarity of said known pattern of one or more of said component signals such that said dither signal includes a sequence of values with said sequence changing polarity during horizontal blanking intervals corresponding to active video; and
   using said dither signal and said analog signal with an A/D coverter to produce a dithered digital signal.

20. A method for digital conversion of an analog signal comprising steps of:
   converting a frequency of a clock signal at a predetermined ratio which varies periodically and conforms to P/N, where P and N are positive integers and $1 \geq P \geq (N-1)$ so as to generate a plurality of component signals each having a known pattern which component signals are combined to provide a dither signal, said dither signal having a variable pattern produced by changing the phase and/or polarity of said known pattern of one or more of said component signals; and
   using said dither signal and said analog signal with an A/D converter to produce a dithered digital signal.

21. A method of converting an analog signal to digital form with an A/D convertor which samples in response to a clock signal comprising:

the step of providing said analog signal;

the step of providing a dither signal having a first known pattern of values chosen relative to the value of an LSB of said A/D convertor such that said dither signal causes a 1 LSB change of the output of said A/D convertor every N clocks whenever said analog signal approaches a quantizing level said A/D converter by an amount of an LSB÷N and with the phase or sequence of said pattern changing in response to said analog signal; and the further step of sampling and converting said analog signal in response to said clock signal and said dither signal so as to generate a first digital signal having a given precision;

the further step of filtering said digital signal having a given precision to provide said digital form of said analog signal.

22. A method of processing a video signal in analog form to convert said video signal to digital in an A/D convertor which samples in response to a clock signal, comprising:

the step of receiving said video signal;

the step of providing said clock signal;

the step of dividing said clock signal by a known amount to provide a dither signal which may take on at least a first known pattern and a second known pattern having at least three magnitude values, one being zero and two or more chosen relative to the value of an LSB of said A/D convertor;

the step of converting said analog signal to digital with said A/D convertor in response to said clock signal and said dither signal such that said dither signal causes a 1 LSB change of the output of said A/D convertor in a known pattern responsive to said first known pattern, whenever said video signal is within a known amount of a quantizing level of said A/D converter; and the step of changing from said first known pattern to said second known pattern in response to a synchronizing portion of said video signal.

23. The invention as claimed in claim 1, 2, 3, 4, 12, 21 or 22 wherein said claimed invention is incorporated within the integrated circuit package containing said A/D convertor where said dither signal is comprised of a pattern of at least $2^Q$ different values where $Q \geq 2$ with said pattern being changed in a known fashion from a first sequence of said values to at least a second sequence of said values and with said A/D convertor having $2_R$ quantizing levels with the quantizing output being filtered to provide a Q+R bit filtered output.

24. A device for converting an analog signal to a digital signal, comprising:

a dither circuit responsive to a clock signal to generate a dither signal which takes on first, second and third values with said third value occurring every N clocks of a cycle of X clocks where N and X are integers, and where said third value has a magnitude equal to said first value and opposite polarity with respect to the average of said three values, and;

an A/D converter circuit responsive to said dither signal and said analog signal to provide said digital signal.

25. A device for converting an analog signal to a digital signal, comprising:

a dither circuit clocked by a clock signal to generate a dither signal which takes on first, second, third and fourth values in a pattern with said fourth value occurring every said N clocks of a cycle of X clocks where N and X are integers, and where said fourth value has a magnitude equal to said second value and opposite polarity with respect to the average of said four values and with said pattern changing in response to said analog signal;

an A/D converter circuit responsive to said dither signal and said analog signal to provide said digital signal.

26. An analog to digital conversion circuit responsive to a conversion clock for converting an analog signal to a digital signal, with said analog signal having a plurality of repetition periods, said circuit including:

a clocking circuit for providing said conversion clock and a dither clock which may be the same clock;

a dither circuit responsive to said dither clock to provide a plurality of component signals, each having a known pattern, with a first component signal responsive to a first said repetition period of said analog signal and a second component signal responsive to a second shorter said repetition period of said analog signal and with said dither circuit further operative to provide a dither signal in response to at least said first and second component signals, and an A/D convertor responsive to said analog signal, said conversion clocking signal and said dither signal to provide said digital signal.

27. A device for converting an analog video signal having horizontal lines making up fields or frames of active video to a digital signal, comprising:

a dither circuit consisting of a binary counter which is clocked in response to horizontal sync and reset periodically in response to vertical sync to generate a dither signal which takes on a plurality of values which occur in a repetitive regular pattern of at least three values with said values being changed at least once per horizontal line of active video and said pattern repeating at a known phase relative to said lines; field or frames;

an A/D converter circuit responsive to said dither signal and said analog signal to provide said digital signal.

28. A device as claimed in claim 27 wherein said analog video signal has verticals corresponding to said fields and said dither circuit includes a binary counter which is incremented for substantially every line of active video and reset by every second vertical thereby synchronizing said dither to the scanning deflection of a display of said analog video signal.

29. A device as claimed in claim 27 having at least first, second, third and fourth ones of said values being offset by substantially ½ LSB steps with said offset values of said dither varied at least line to line during active video and with said pattern being restarted at least as often as every frame.

30. A device for converting an analog signal to a digital signal, comprising:

a clock generator to provide a stream of sampling clocks;

a dither circuit to generate a dither signal which takes on a plurality of values which occur in a repetitive pattern said pattern having a component which is alternated in response to said analog signal;

an A/D converter circuit responsive to said dither signal and said analog signal to provide a digital sample at a known number of bits resolution for each said sampling clock;

further circuitry to process sequential ones of said digital samples to provide said digital signal carrying samples at a clock frequency lower than said stream of sampling clocks, said digital signal having reduced visibility of said dither.

31. A method of quantizing an analog signal to provide a series of discrete output values including the steps of:
generating a clock signal in response to a periodic component of said analog signal,
establishing a plurality of quantizing intervals and quantizing levels related thereto,
generating a dither signal having a plurality of dither levels in response to said clock signal, said dither signal having a repeating pattern of N clock cycles said pattern comprised of a sequence of N values which sequence changes order in response to said analog signal and a minimum step size between said dither levels corresponding to said 1 quantizing interval÷N where N is an integer,
quantizing said analog signal in response to said quantizing levels and said dither signal to provide a plurality of quantized values at a first rate,
filtering said plurality of quantized values to provide said output values at a different rate than said first rate.

32. A method of quantizing an analog signal to provide output samples including the steps of:
generating a clock signal,
generating a multiple level dither signal synchronous with said clock signal said dither signal having a pattern of a sequence of values which said sequence changes in a repetitive fashion in response to said analog signal,
quantizing said analog signal in response to said dither signal and said clock signal to provide quantized samples,
filtering said quantized samples to provide said output samples at an output rate different than said clock signal.

33. A device for converting an analog signal to a digital signal, comprising:
means for providing an analog signal;
dither circuit responsive to a clock signal to generate a dither signal which takes on at least first, second and third values with said third value occurring every N clocks of a cycle of X clocks where N and X are integers, and where said third value is of equal magnitude and opposite polarity with respect to said first value;
an A/D converter circuit responsive to said dither signal and said analog signal to provide said digital signal.

34. An analog signal processing device for changing said analog signal to digital form in an A/D convertor, comprising:
means for providing an analog signal;
dither circuit responsive to a clock signal to generate a dither signal having at least first, second and third values with said third value occurring every N clocks of a cycle of X clocks where N and X are integers, and where said third value is of equal magnitude and opposite polarity with respect to said first value;
an analog to digital conversion circuit responsive to said values and to said analog signal to provide said digital form thereof.

35. An analog signal processing device for converting said analog signal to a digital version in an A/D convertor, comprising:
means for receiving said analog signal;
dither means responsive to a clock signal to generate a dither signal having at least first, second and third values with said third value occurring every N clocks of a cycle of X clocks where N and X are integers, and where said third value is of equal magnitude and opposite polarity with respect to said first value;
an A/D means including said A/D convertor and responsive to said dither signal and said analog signal to provide said digital version of said analog signal.

36. An analog signal processing device for converting said analog signal to digital form with an A/D convertor, comprising:
means for providing said analog signal;
dither circuit providing a clock signal responsive to said analog signal and further providing a dither signal having a known pattern of at least first, second and third values with said third value occurring every N clocks of a cycle of X clocks where N and X are integers, and where said third value is of equal magnitude and opposite polarity with respect to said first value and with at least two components of said pattern changing in response to said analog signal;
said A/D convertor responsive to said dither signal and said analog signal to provide said digital form of said analog signal.

37. A device for converting an analog signal to a digital signal, comprising:
means for providing an analog signal;
dither circuit responsive to a clock signal to generate a dither signal which takes on a pattern of at least first, second, third and fourth values with said fourth value occurring every N clocks of a cycle of X clocks where N and X are integers, and where said fourth value is of equal magnitude and opposite polarity with respect to said second value and where said pattern is changed in response to said analog signal;
an A/D converter circuit responsive to said dither signal and said analog signal to provide said digital signal.

38. An analog signal processing device for changing said analog signal to digital form in an A/D convertor, comprising:
means for providing an analog signal;
dither circuit responsive to a clock signal to generate a dither signal having at least first, second, third and fourth values with said fourth value occurring in a pattern every N clocks of a cycle of X clocks where N and X are integers, and where said fourth value is of equal magnitude and opposite polarity with respect to said second value and where said pattern is changed in response to said analog signal;
an analog to digital conversion circuit responsive to said values and to said analog signal to provide said digital form thereof.

39. An analog signal processing device for changing said analog signal to a digital version in an A/D convertor, comprising:
means for receiving said analog signal;
means to generate a clock signal in response to said analog signal;
dither means responsive to said clock signal to generate a dither signal having a known pattern having at least first, second, third and fourth values with said fourth value occurring every N clocks of a cycle of X clocks where N and X are integers, and where said fourth value is of equal magnitude and opposite polarity with respect to said second value;
converting means responsive to said dither signal and said analog signal to provide said digital version of said analog signal.

40. An analog signal processing device for converting said analog signal to digital form with an A/D convertor, comprising:

means for providing said analog signal;

dither circuit providing a clock signal responsive to said analog signal and further providing a dither signal having a pattern of at least first, second, third and fourth values with said fourth value occurring every N clocks of a cycle of X clocks where N and X are integers, and where said fourth value is of equal magnitude and opposite polarity with respect to said second value, said pattern changing in response to said analog signal and said clock signal;

said A/D convertor responsive to said dither signal and said analog signal to provide said digital form of said analog signal.

41. A processing device for an analog video signal having an associated synchronizing type component, said processing device comprising:

a sampling clock generator for providing a sampling clock in response to said synchronizing component, and further providing a dither clock;

dither circuit responsive to said dither clock to provide a dither signal having a pattern which has a plurality of versions and each said version is periodically repeated P times in N respective dither clock cycles, in a ratio of 1:(2N), where N is a positive integer;

converting circuit responsive to said dither signal and said analog video signal to provide a dithered digital video signal.

42. A device for converting an analog video signal to a digital signal, including:

an analog to digital converter circuit responsive to a dither signal and said analog video signal to provide said digital signal;

and a dither circuit which provides said dither signal having first, second, third and fourth values which are offset by substantially ½ LSB steps with said value being changed at least line to line during at least part of active video, and with said first value being equal in magnitude, opposite in polarity and of the same time duration as said fourth value, said second value being equal in magnitude, opposite in polarity and of the same time duration as said third value, with said magnitudes and polarities being with respect to the average of the four said values, said dither circuit including a binary counter which is incremented for substantially every horizontal line of the active video portion and reset for every second vertical of said video signal.

43. A method for converting an analog video type signal to a digital signal, including the steps of:

receiving said analog video type signal;

performing an analog to digital conversion step in response to said analog video type signal and a dither signal to provide said digital signal, which said analog to digital conversion step may include filtering of said digital signal;

providing said dither signal which takes on at least first, second, third and fourth different values in a known sequence, with said values differing by substantially ½ LSB steps with said first value being equal in magnitude, opposite in polarity and of the same time duration as said fourth value, said second value being equal in magnitude, opposite in polarity and of the same time duration as said third value, with said magnitudes and polarities being with respect to an average of said first and said fourth values, and with said dither changing in response to said analog video type signal for at least every horizontal line of the active video portion thereof and reset for every second vertical of said video type signal.

* * * * *